United States Patent [19]

Dawson et al.

[11] Patent Number: 4,748,773

[45] Date of Patent: Jun. 7, 1988

[54] BIASED GRINDING ASSEMBLY

[75] Inventors: Thomas F. Dawson, Millis; Paul C. Ewing, Tewksbury, both of Mass.

[73] Assignee: The Charles Stark Draper Laboratory, Inc., Cambridge, Mass.

[21] Appl. No.: 23,821

[22] Filed: Mar. 9, 1987

Related U.S. Application Data

[63] Continuation-in-part of Ser. No. 772,269, Sep. 3, 1985, Pat. No. 4,648,211.

[51] Int. Cl.⁴ ............................................. B24B 49/02
[52] U.S. Cl. ..................................... 51/165 R; 29/593; 29/603; 360/126
[58] Field of Search ...................... 51/165 R, 281 R; 29/593, 603; 360/126

[56] References Cited

U.S. PATENT DOCUMENTS

| | | | |
|---|---|---|---|
| 3,787,638 | 1/1974 | Murai | 29/603 |
| 4,155,106 | 5/1979 | Muraoka | 29/603 |
| 4,208,783 | 6/1980 | Luther et al. | 29/593 |
| 4,477,968 | 10/1984 | Kracke et al. | 29/593 |
| 4,511,942 | 4/1985 | Valstyn | 29/603 |

OTHER PUBLICATIONS

Grandison, P. J., IBM Tech Disclosure Bulletin, vol. 13, No. 4, Sep. 1970.
Hastie, W. M., "Gang Tackle" Circuits Manufacturing, Mar. 1986, p. 27.

*Primary Examiner*—Harold D. Whitehead
*Attorney, Agent, or Firm*—Joseph S. Iandiorio; Douglas E. Denninger

[57] ABSTRACT

A grinding assembly for grinding an object such as a printed circuit board coupon at a predetermined angle and to a predetermined grinding depth, including a control board carrying a grinding guide having at least two conductive leads and a conductive control track interconnecting the conductive leads, and a shelf having an upper surface for supporting the object. The shelf is positioned relative to the control board to establish a grinding surface for the object biased at the predetermined angle. The shelf is further positioned to align the predetermined grinding depth of the object with a portion of the rear edge of the control track so that the track is ground through when the object is ground along the biased grinding surface to the predetermined grinding depth.

21 Claims, 11 Drawing Sheets

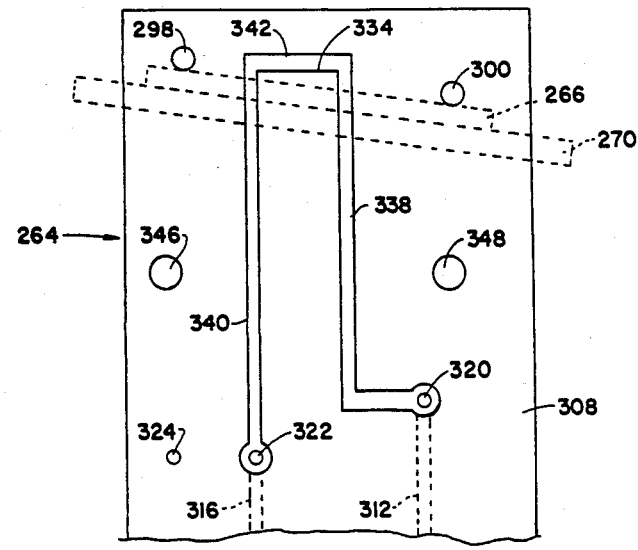
FIG. 12
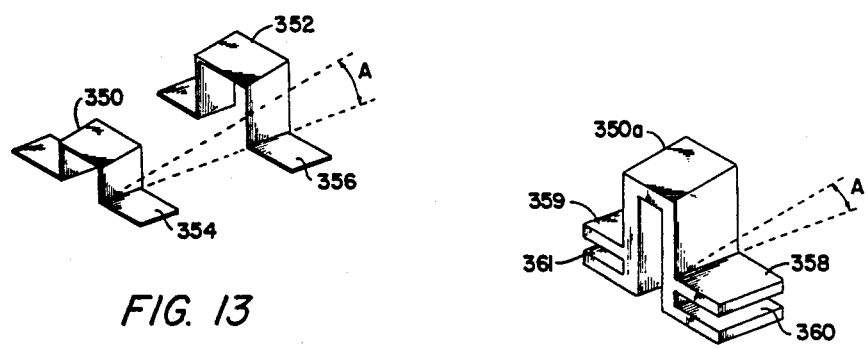
FIG. 13
FIG. 14

BIASED GRINDING ASSEMBLY

RELATED APPLICATION

This application is a continuation-in-part of U.S. Ser. No. 772,269, filed Sept. 3, 1985, "Grinding Guide and Method of Controlling the Automatic Grinding of Objects", by Dawson et al and now U.S. Pat. No. 4,648,211 issued Mar. 10, 1087.

FIELD OF INVENTION

This invention relates to an assembly for accomplishing the biased grinding of an object and more particularly to such a biased grinding assembly which accurately exposes at a selected angle and at a pretermined guiding depth a region in the object.

BACKGROUND OF INVENTION

Presently, grinding operations are controlled primarily by establishing timing intervals for each application of an abrasive to an object to be ground and by human observation of the rate at which the abrasives wear away the object being ground. In another control procedure, a grinding operator attempts to set mechanical stops at a level corresponding with the desired grinding depth for each grinding operation.

One such object to be ground is a coupon for a printed circuit board. Printed circuit boards provide the mounting surface and electrical interconnection system for components such as diodes, resistors and capacitors. While originally the circuit boards were only printed on a single side, most circuit boards today are double-sided or multilayered. Multilayer printed circuit boards, that is, circuit boards having circuits that are printed on several layers of the boards, require uniform, dependable electrical connections between the layers. These critical connections are typically provided by plated-through holes prepared by drilling holes through the stacked board layers. The drilled holes are plated with copper and then solder to establish the electrical interconnections. Each and every plated-through hole must maintain a predetermined, uniform thickness: pores, cracks, nodules and other faults in plating render the entire circuit board defective.

Moreover, the reliability of the entire printed circuit board depends on proper adhesion of the solder layer to the copper layer. Solder separation is a serious problem in some situations, particularly for prolonged use at temperatures of 120°–130° F. as discussed in Kumar, K. and Moscaritolo, A., "Optical and Auger Microanalyses of Solder Adhesion Failures in Printed Circuit Boards," 128 J. Electrochem. Soc. 379–383 (1981). Oxide particles accumulate at the interface of the solder layer and the copper layer and eventually cause solder adhesion failure.

A number of printed circuit boards are typically defined on a single panel of material. Fortunately for inspection purposes, plating faults typically appear in most of the plated-through holes or the copper-solder interfaces of a printed circuit board if any faults are present at all. Therefore, one or more coupons are defined on the panel for each circuit board to be printed. For examining the copper-solder interface, each coupon has one or more elongated pads which are plated simultaneously with the printed circuit board. The coupons are labelled with a specific identification code for the individual board and are detached for later examination.

It is desirable to grind the coupons at a slight angle to expose more of the interface. The amplification of the exposed interface is particularly important since the layers are so thin: the copper layer and the solder layer are typically two to three mils thick and the interface is even thinner. Presently, one or more coupons are placed on a Teflon cylinder having a six degree bias. A potting mold is mounted over the coupon and the cylinder and is filled with a potting material to form a first potted surface. The mold is removed, and the partially potted coupons are lifted from the Teflon cylinder and turned upside down. A second mold is mounted over the exposed face of the coupons and additional potting material is added so that the coupons are now completely embedded in potting material which serves as a holder for the coupons.

Unfortunately for inspection purposes, grinding is presently a tedious, time-consuming process since great accuracy is demanded. At least three or four steps are involved which are accomplished manually or semi-automatically by human supervision of a grinding machine. Grinding machines accept one or more holders in a disk which is equipped with a number of adjustable mechanical stops including hardened material such as diamond.

The first potted surface of each holder is ground for several minutes against coarse grit rotating at several hundred rpm. The coarse grit is replaced with medium grit, which is rotated against the holders for an additional period of time. When a semi-automated machine is used, the operator removes the coupons from the medium grit after all diamond stops contact the grit; the operator then resets the diamond stops. Fine grit is then applied against the coupons for thirty to fifty seconds or until all the diamond stops again contact the abrasive. For the grinding machine, the diamond stops are reset flush with the holder. Finally, the coupons with their copper-solder interfaces exposed at a bias are treated in one or more polishing steps.

The sheer cost and labor of grinding one or more coupons per circuit board present serious problems in view of the ever-increasing millions of printed circuit boards that are produced annually. Presently, most coupons are ground manually at the cost of $15-20 per coupon. Manual grinding requires constant operator attention and frequent inspection using a microscope. Each visual inspection interrupts the grinding operation. The dependability of the operator varies greatly: overgrinding and undergrinding occur frequently. Since the coupons are exposed destructively, a mistake in overgrinding is irreparable and results in the complete invalidation of the matching printed wire board unless a second coupon is available for complete regrinding. Undergrinding, when detected, is cured by returning the coupon to the operator, who must remount it and commence additional, unscheduled grinding.

Semi-automated or machine-assisted grinding also requires close operator attention. The machines are more dependable than grinding by hand but are not reliable for exposing the thin interfaces due to cumulative sources of error. The coupons can be misplaced relative to the potting material which results in under- or overgrinding of the coupon. Further, the holder can be initially misaligned in the disk relative to the setting of the mechanical stops, and the stops themselves can wear over time. Also, several holders can be misplaced in a disk relative to each other.

One apparatus attempts to automate grinding by interconnecting two terminal strips with a shorting conductor that is deposited on a substrate to be ground. The grinding operation is controlled by the amount of current flow through the shorting conductor. This technique is relatively inaccurate, however, and relies on final finishing by hand.

SUMMARY OF INVENTION

It is therefore an object of this invention to provide a biased grinding assembly which accurately controls grinding along a plane biased to the surface to be ground of an object.

It is a further object of this invention to provide a biased grinding assembly for the grinding of printed circuit board coupons to expose copper-solder interfaces.

It is a further object of this invention to provide such a biased grinding assembly which is adapted for fully automated grinding.

It is a further object of this invention to provide such a biased grinding assembly which can accurately control a multiplicity of coupon grinding steps.

It is a further object of the invention to provide such a biased grinding assembly which prevents overgrinding or undergrinding of coupons.

The invention results from the realization that truly effective control of grinding of an object such as a printed circuit board coupon at an angle relative to its surface can be achieved by mounting the coupon on a shelf which is accurately positioned and biased relative to a consumable control board carrying a grinding guide, the guide having a control track, mounted on the control board, which interconnects two conductive leads, and the shelf positioned such that a break in the track occurs simultaneously with the grinding to a desired, predetermined depth of the coupon to expose it at that angle.

This invention features a grinding assembly for grinding an object at a predetermined angle and to a predetermined grinding depth. There are a control board carrying a grinding guide having at least two conductive leads and a conductive control track interconnecting the conductive leads, and a shelf having an upper surface for supporting the object. The shelf is positioned relative to the control board to establish a grinding surface for the object biased at the predetermined angle. The shelf is further positioned to align the predetermined grinding depth of the object with a portion of the rear edge of the control track so that the track is ground through when the object is ground along the biased grinding surface to the predetermined grinding depth.

In one embodiment, the grinding assembly further includes means for positioning the shelf and the control board relative to each other, such as at least two tooling pin holes in the control board for receiving tooling pin means for engaging the shelf to align it with the control board. The tooling pin holes may be located to orient the tooling pin means to engage the upper surface of the shelf. The tooling pin means may be metal pins formed of a soft metal which is readily ground through. Alternatively, the means for positioning includes bracket means for securing the shelf relative to the control board. The bracket means may include means for slidably engaging the control board and clip means for slidably receiving the shelf In another embodiment, the control track includes a plated-through hole passing through the control board and the grinding assembly further includes means for attaching the object to the shelf. The grinding assembly may be potted in a potting material, and the grinding guide may further include a second control track interconnecting the conductive leads and having at least a portion of its rear edge precisely located with respect to the rear edge of the other control track. The control board may have a number of layers and each control track is disposed on a different one of the layers.

In yet another embodiment, the shelf is formed in a cup for carrying the object during grinding. The shelf may include one or more lands for elevating the object at the predetermined angle, and the cup may further include a slot for receiving the control board, the slot having a predetermined depth in relation to the upper surface of the shelf. The object to be ground may be a printed circuit board coupon having a plating interface to be exposed.

DESCRIPTION OF PREFERRED EMBODIMENTS

Other objects, features and advantages will occur from the following descriptions of preferred embodiments and the accompanying in which.

Figure 3A:
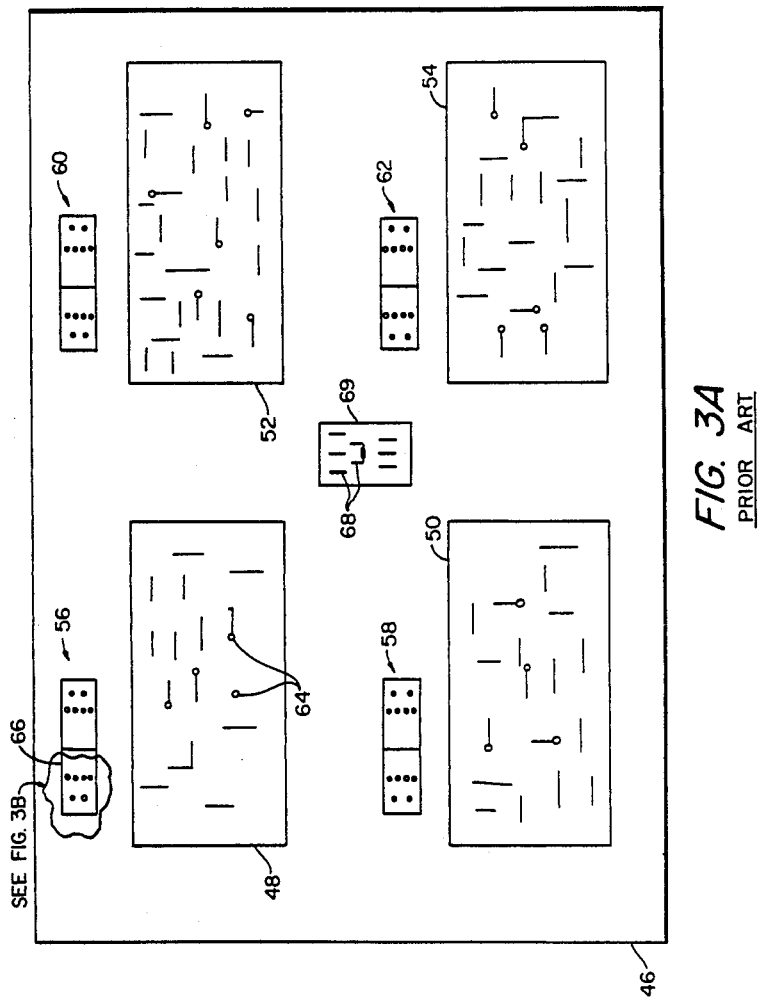
Figure 3B:
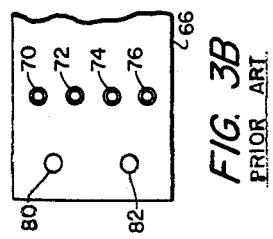
Figure 4:
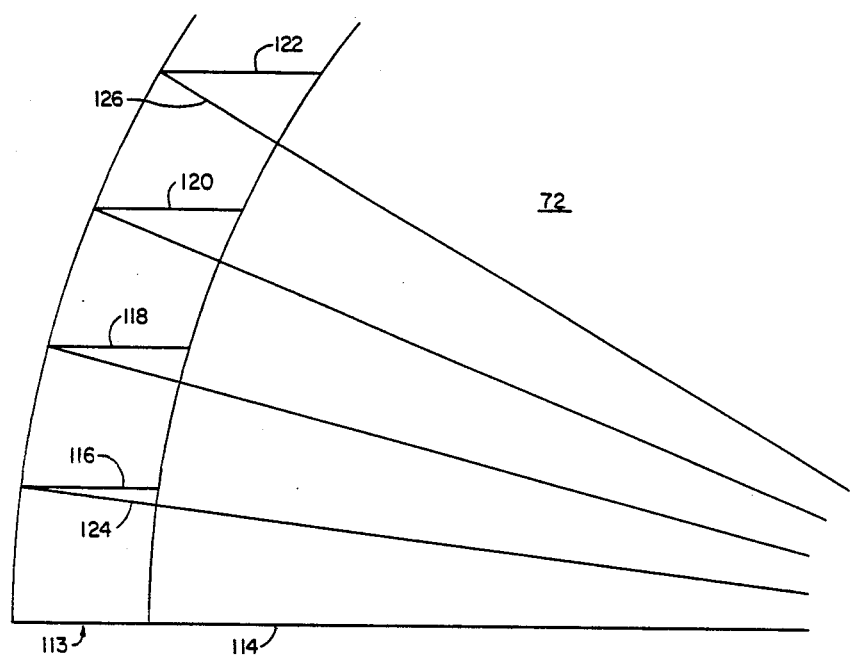
Figure 5A:
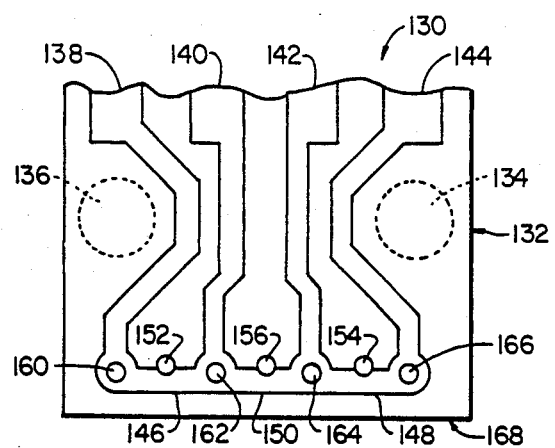
Figure 5B:
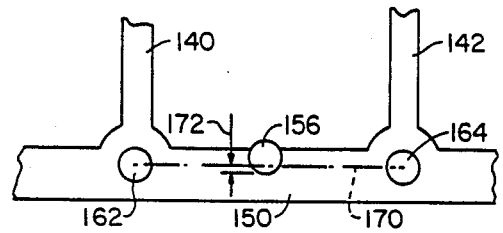
Figure 6:
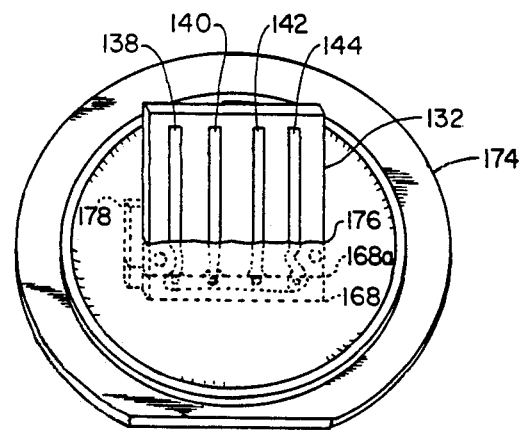
Figure 7:
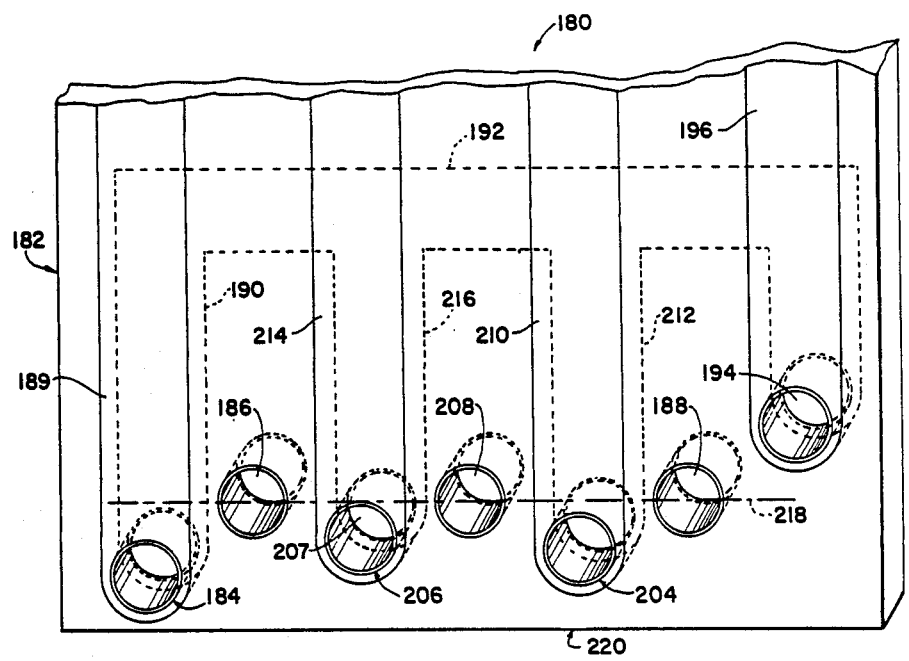
Figure 8A:
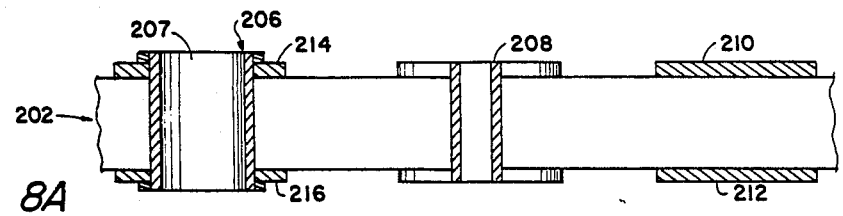
Figure 8B:
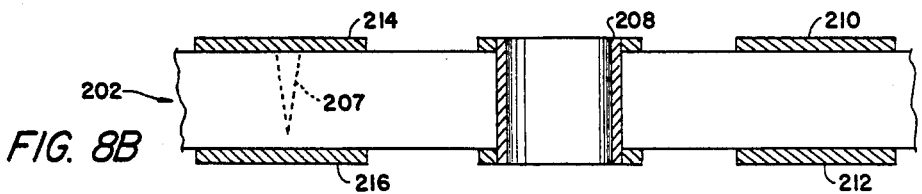
Figure 9:
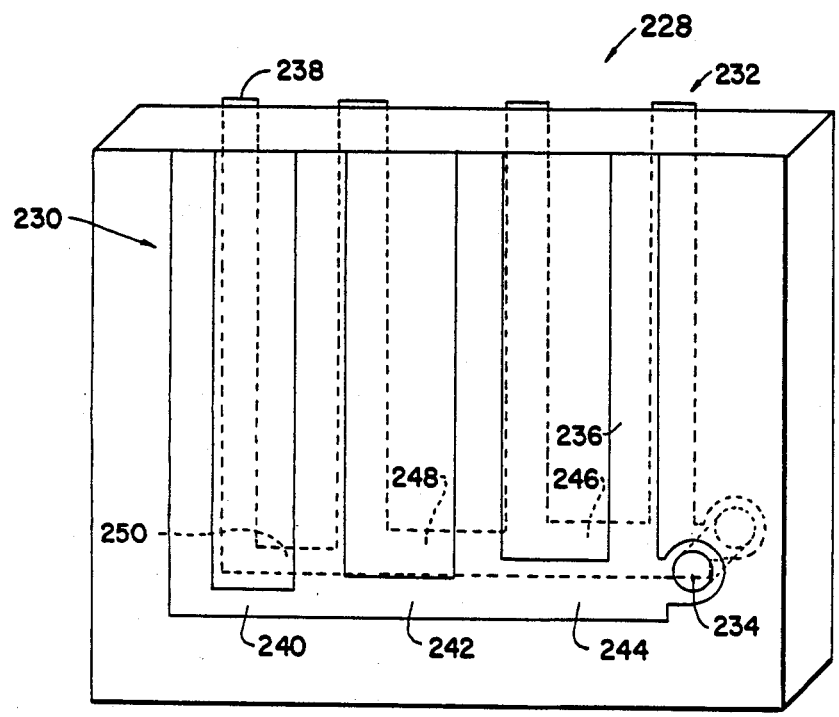
Figure 10B:
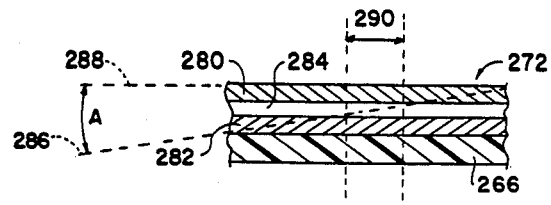
Figure 10A:
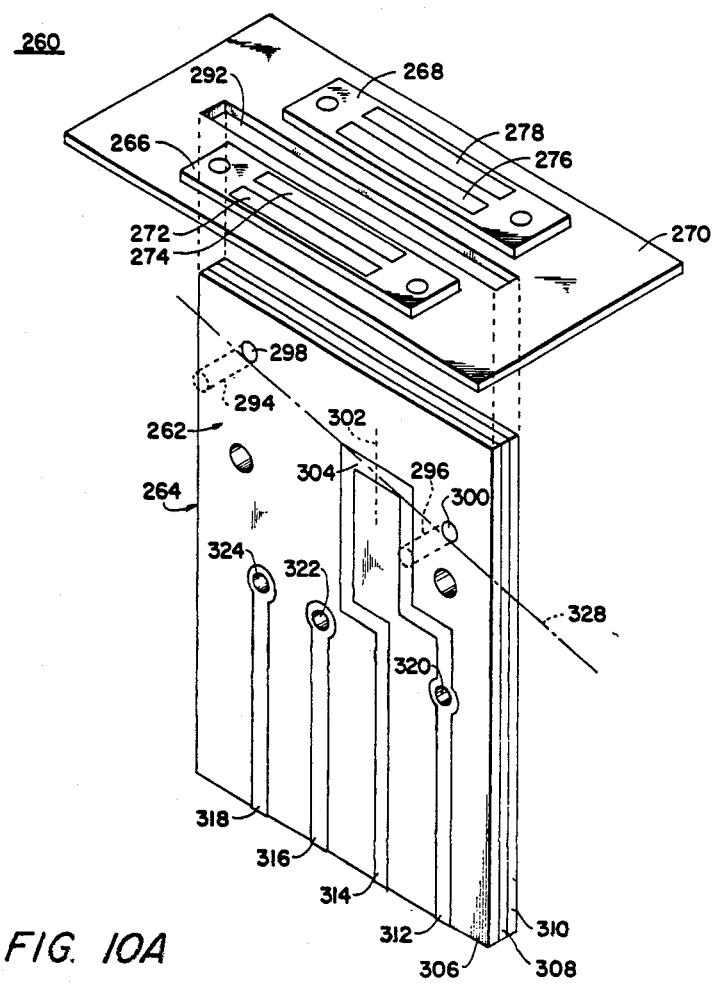
Figure 11:
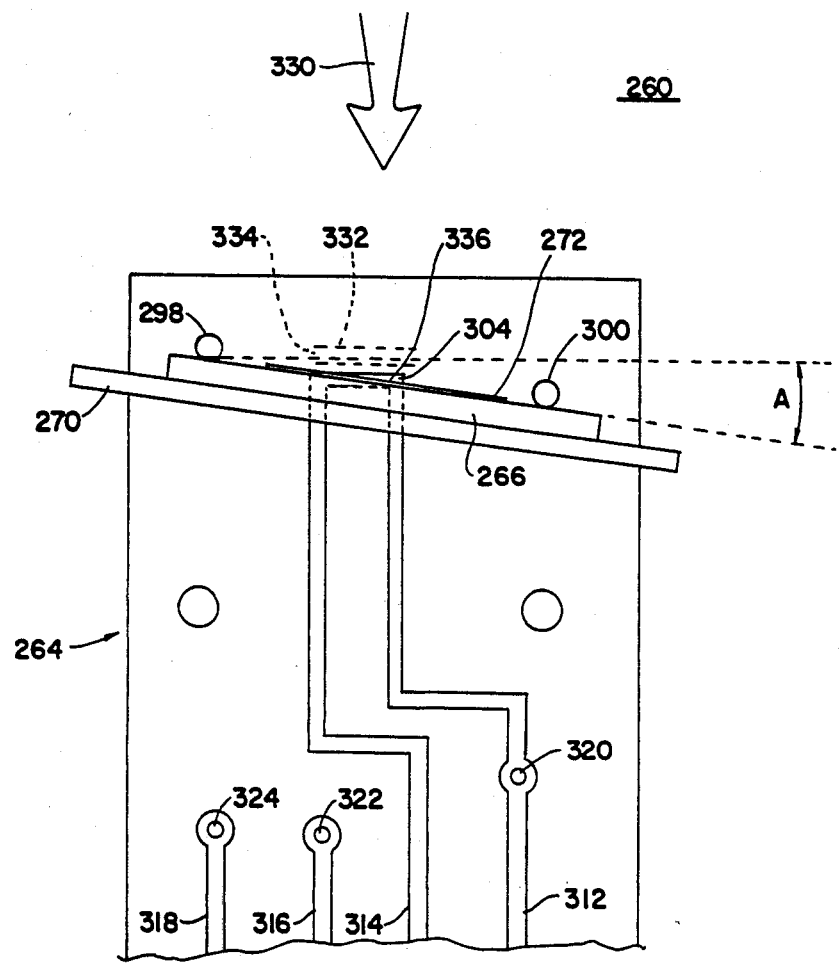
Figure 15:
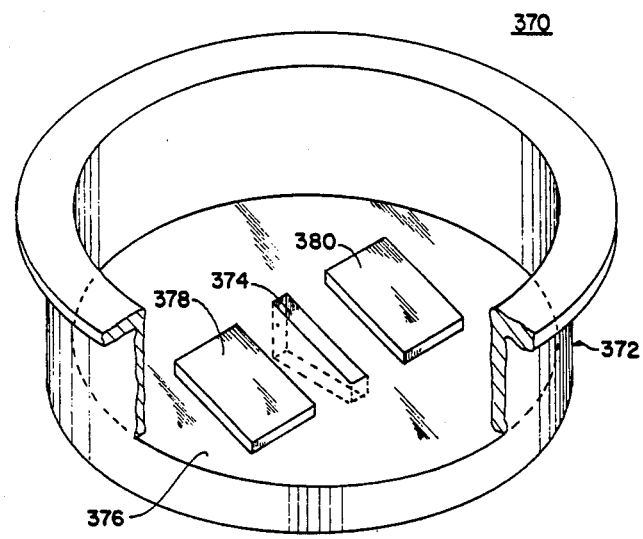
Figure 16:
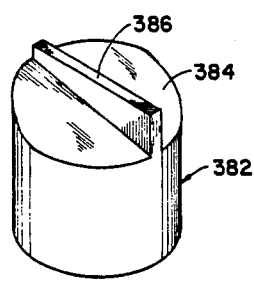

FIG. 3A top plan view of conventional coupons and disposed on a panel;

FIG. 3B an enlarged view of one of the coupons of FIG. 3A;

FIG. 4 is a chart of error arising during measurement of plating thickness relative to the distance of the cross section from the diameter of the test hole;

FIG. 5A is a top plan view of a novel biased grinding assembly that is printed on a coupon;

FIG. 5B is an enlarged detailed view of a portion of a control track of FIG. 5A showing its following edge aligned by a drilled hole;

FIG. 6 is an axonometric view of the coupon of FIG. 5A embedded in a coupon mount;

FIG. 7 is a top plan view of a novel grinding guide on a coupon and utiliziing drilled, plated-through holes as the control tracks;

FIGS. 8A and 8B are schematic cross-sectional views of the coupon of FIG. 7 after successive stages of grinding;

FIG. 9 is an axonometric view of two novel grinding guides interconnected by a common plated-through hole to enable successive monitoring of the guides;

FIG. 10A isa schematic exploded axonometric view of a biased grinding assembly according to this invention carrying coupons whose copper-solder interfaces is to be exposed;

FIG. 10B is a cross-section of one of the coupons shown in FIG. 10A;

FIG. 11 is a schematic elevational view of the grinding assembly of FIG. 10;

FIG. 12 is a schematic elevational view of the inner layer of the control board shown in FIGS. 10A and 11;

FIG. 13 is a schematic axonometric view of two brackets for positioning the shelf shown in FIG. 10A;

FIG. 14 is an exonometric view of a more complex bracket;

FIG. 15 is a partial cutaway axonometric view of an alternative grinding assembly according to this invention with the control board removed;

FIG. 16 is tool for forming the shelf and groove shown in FIG. 15; and

Figure 17:
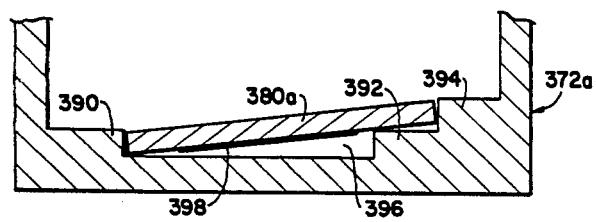

FIG. 17 is a cross-sectional view of an alternative shelf configuration.

This invention may be accomplished by a biased grinding assembly having a shelf for supporting an object to be ground at a predetermined angle and to a predetermined grinding depth, and a control board carrying a grinding guide having one or more conductive control tracks, each control track interconnecting a pair of conductive leads. The shelf is positioned relative to the control board to establish a grinding surface biased at the predetermined angle and to align the predetermined grinding depth of the object with a portion of the rear edge of the control track so that the track is ground through when the object is ground to the predetermined grinding depth.

Figure 1:
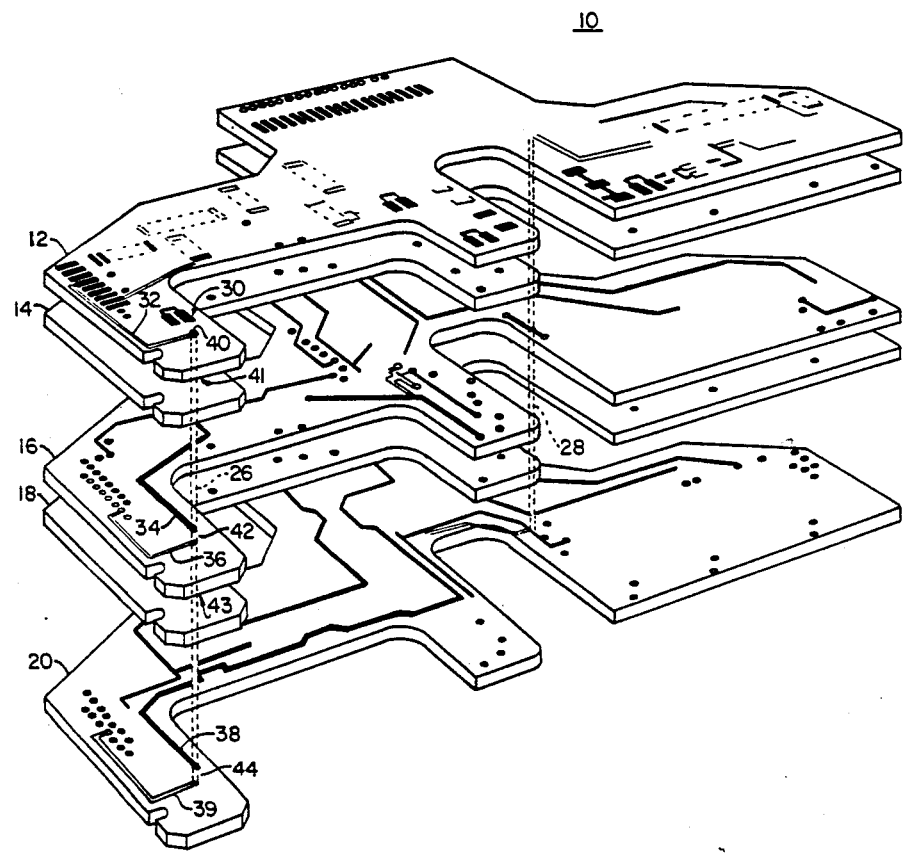
FIG. 1 is an exploded axonometric view of a conventional multi-layer circuit board.

While a biased grinding assembly according to this invention can be utilized for objects such as coupons for single- or double-sided circuit boards, the biased grinding assembly is particularly useful for the grinding of coupons for multilayer circuit boards, such as shown in FIG. 1, since a great deal of time and money is invested in each multilayer board. Multilayer printed circuit board 10 includes layers 12, 14, 16, 18, and 20. Circuit board layers 12, 16, and 20 are printed on both sides to place copper cladding on those layers to form the circuits. The circuits are insulated from each other by insulating layers 14 and 18, respectively. Circuits printed on the upper sides of board layers 12, 16, 20 are shown as solid lines while the printed circuits on the underside of these layers are indicated by open lines.

After assembly and alignment of the board layers and the insulating layers relative to each other, the boards are selectively plated to establish plated-through holes to complete the circuits; holes 26, 28, shown in phantom, represent the electrical interconnection provided by the plated-through holes. Components on mounts 30, for example, are interconnected to other components by lines 32, 34, 36, and 38 when holes 40, 41, 42, 43 and 44 in their respective layers are plated as a single plated-through hole as illustrated by hole 26.

Figure 2:
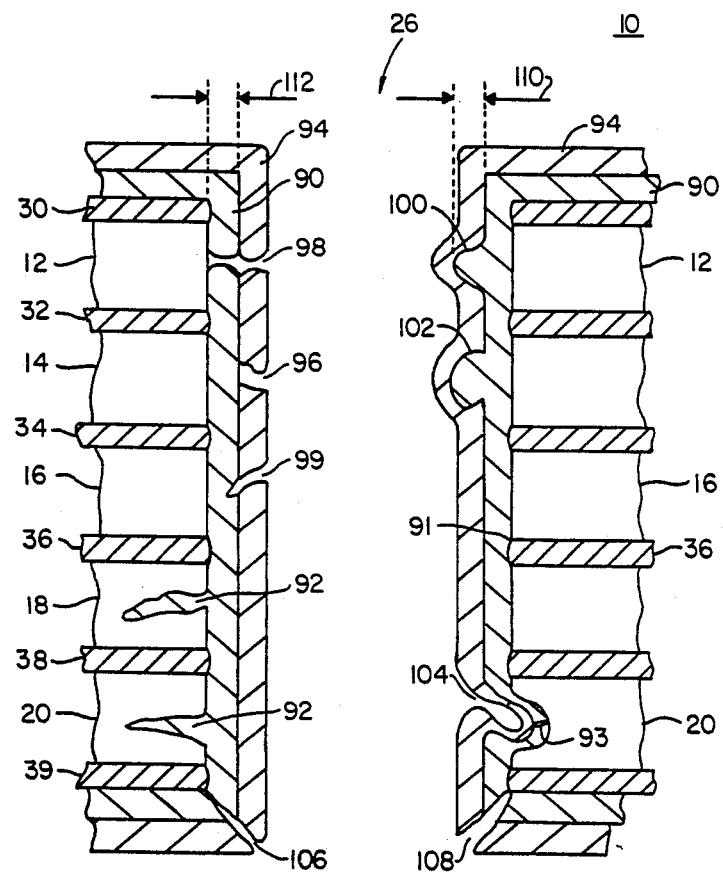
FIG. 2 is a cross-sectional view of an exposed plated-through the multilayer circuit board of FIG. 1 illustrating faults in the plating operation.

Plated-through hole 26 of assembled multilayer circuit board 10, FIG. 1, is shown in cross-section in FIG. 2 to illustrate possible faults rising during the final plating-through stage of manufacture; these faults will hopefully be discovered by examining test holes in accompanying coupons. Printed circuit boards 12, 16 and 20 are shown with upper and lower copper cladding 30 and 32, 34 and 36, and 38 and 39, respectively. The circuits are separated internally by insulating layers 14, 18 unless a plated-through hole such as hole 26 electrically connects these circuits. After the layers are assembled together, an additional plating step plates copper cladding 90 through hole 26. Artifact 91 represents a resin smear that was not properly removed and which diminishes the electrical connection between cladding 36 and plating 90. Wicking 92 in the laminate indicate a weakened structure and the potential for short circuits between copper cladding circuits. Channel 93 is a hairline crack in plating 90.

Solder plating 94 is then plated over copper plating 90. Defect 96 indicates discontinuous plating while void 98 illustrates a void in the plating penetrating through both copper plating 90 and solder plating 94. Channel 99 represents a large crack which penetrates copper plating 90. While some defects such as nodule 100 are acceptable, copper plating 90 may develop an unacceptable nodule 102. Also unacceptable are plating pocket 104 and circumferential cracks 106, 108.

Finally, the platings themselves have specified thicknesses. Dimension arrows 110 indicate the range of desired plating thickness for solder plating 94, which is typically 0.0025 to 0.005 cm. Dimension arrows 112 represent that the range of acceptable widths for copper plating 90 is 0.0025 to 0.005 cm.

The need to determine the quality of plating-through is readily apparent. Also apparent is that individual electrical testing of each and every plated-through hole is expensive and time consuming. Further, destructive testing best exposes the defects yet cannot be performed on the printed circuit boards themselves. Separate coupons having a number of sacrificial test holes therefore provide a practical mechanism for ascertaining the plating quality.

Typically, a number of circuit boards are printed on a single panel such as panel 46, FIG. 3A. Printed wire boards 48, 50, 52, and 54 have coupon pairs 56, 58, 60 and 62 located in close proximity on panel 46 to their respective printed wire boards. To test the quality of printing, lines 68 on coupon 69 are later stressed to assure prope plating. To test the quality of plated-through holes such as holes 64 in printed wire board 48, test holes on coupon 66 of coupon pair 56 are subsequently examined in cross-section.

Coupon 66 is shown in greater detail in FIG. 3B. Typically, test holes 70 and 72 are drilled before holes 64 are drilled and test holes 74 and 76 are drilled afterward to monitor the quality of the drill bit starting and finishing work on board 48. Test holes 70, 72, 74 and 76 are plated through simultaneously with holes 64.

Also shown are alignment holes 80, 82 used for conventionally aligning the coupons in a mold before potting material is added to form a holder which carries the coupon. Coupon 66 is removed from panel 46 using shears or a punch.

When test holes in a coupon are exposed in cross-section, the depth of exposure affects the measurement of plating thickness. FIG. 4 is a chart of error arising during the measurement of the thickness of copper plating 113 relative to the distance of the cross section from the diameter of plated-through hole 72, FIG. 3B. Line 114 represents a cross section corresponding with the diameter while lines 116, 118, 120 and 122 represent cross sections of exposure which are increasingly displaced from diameter 114. The measurement error with respect to displacement from diameter 114 in mils is shown in Table I when hole 72 is 16 mils and plating 113 is 1 mil.

TABLE I

| MIL DISPL | MEASUREMENT ERROR (mil) |
| --- | --- |
| 1.0 | 0.0250 |
| 2.0 | 0.0625 |
| 3.0 | 0.1000 |
| 4.0 | 0.1750 |

Cross section 116 is displaced 25.0 $\mu$m—1 mil—relative to line 114. The difference in length between radius line 124 within copper plating 90 and cross section 116 is 0.025 mil. Cross section 122 overestimates the true thickness represented by line 126 by 0.175 mil, which is a 17.5 percent measurement error.

Such error from overgrinding and undergrinding can be prevented using novel grinding guide 130 as shown in FIG. 5A. Grinding guide 130 is mounted on coupon 132. Tooling holes 134, 136, shown in phantom, are not part of grinding guide 130 but are utilized during conventional handling and alignment of coupon 132. Grinding guide 130 includes conductive leads 138, 140, 142, and 144. Conductive leads 138 and 140 are interconnected by conductive control track 146, leads 142 and 144 are connected by track 148, and leads 140 and 142 are connected by track 150. Control holes 152, 154 and 156 define tracks 146, 148 and 150 as tracks which are successively broken during three grinding steps such as coarse, medium and fine grinding. While the control holes are shown as drilled holes, track material encompassed by hole 152, for example, can be removed by laser etching or other removal method.

Electrically conductive leads 138, 140, 142 and 144 are shown associated with plated-through test holes 160, 162, 164 and 166. As surface 168 of coupon 132 is being ground to expose those test holes in cross section, a break occurs first in track 146 as the grinding erodes material up to control hole 152. A circuit is formed by providing power to lead 140, or another lead responsive to track 150, and sensing current or voltage on lead 138. The circuit is broken when surface 168 is ground through track 146 to control hole 152. A predetermined grinding depth is thereby established by that control track.

After track 146 is breached, a lesser abrasive is applied to grinding surface 168 until track 148 is broken. Finally, grinding with a fine abrasive continues until track 150 is broken. When it is desirable to maintain positive power on a single lead rather than transferring power to successive leads as successive tracks are monitored, track 140 or 142 can be designated as a power lead and the remaining three tracks can be monitored for sudden drops in power indicating a broken track. Alternatively, one can sense an inductive pulse generated as the track is ground through.

Conductive leads 140, 142 and control track 150 are shown in an enlarged view in FIG. 5B. Control hole 156 is shown in relation to diameter 170 passing through the centers of test holes 162, 164. Dimension 172 illustrates that control hole 156 precedes diameter 170 by a small amount to ensure that the grinding machine conducting the grinding operation has sufficient time to retract coupon 132 from the abrasive and to allow some of surface 168 to be further eroded during polishing. For typical coupon grinding operations, the anticipation distance represented at 172 is 1 to 2 mil. Control track 154, FIG. 5A, anticipates the diameter of the test holes by 3 mil and coarse control track 152 anticipates by 6 mil.

To prepare coupon 132 for grinding, it is "potted" in potting material such as Epo-Kwik epoxy, available from Buehler, which hardens to form coupon mount 174, FIG. 6. Coupon 132 is surrounded by potting material up to line 176. During grinding, surface 168 of coupon 132 is ground down to surface 168a, indicated in phantom.

Conductive leads 138, 140, 142 and 144 are shown slightly raised in thickness so that they project somewhat from the surface of coupon 132. The projection facilitates mating with an edge connector of the grinding machine.

While individual grinding control per coupon is most accurately obtained by grinding a single coupon at a time, two or more coupons can be mounted in the same mount as indicated by coupon 178, shown in phantom. Additional coupons are aligned during potting relative to coupon 132, for example. It is desirable for the upper portion of each non-monitored coupon 178 not to extend far above upper potting material limit 176: physical interference with the interconnection of monitored coupon 132 and the grinding machine is thereby avoided. Coupon 132 is then monitored during grinding to control the grinding of all coupons in mount 174.

Grinding guide 180, FIG. 7, is mounted on two different faces of coupon 182 which are interconnected by control track holes 184, 204, 206. Control track holes 184, 204, 206 are drilled and plated through during the same process in which test holes 208, 186, 188 are formed. Control track hole 204 interconnects upper conductive lead 210 with lower conductive lead 212, shown in phantom. Similarly, control track hole 206 interconnects upper conductive lead 214 with lower conductive lead 216, and control track hole 184 interconnects lead 189 with lead 190.

In this construction, grinding guide 180 mates with an edge connector having only four contacts, all of which are on the same plane. This convenient arrangement is achieved by connecting lower conductive leads 190, 216, 212 through common lead 192 and plated-through hole 194 to power-supply lead 196.

The rear edges of control track holes 184, 204, 206 are precisely located with respect to the central line of test holes 186, 188, 208, indicated by dashed line 218. During grinding, an abrasive is applied to grinding surface 220 until the rear edge of each control track hole 184, 204, 206 is successively ground through. For example, control track hole 204 is ground through as shown in FIG. 8A. Test hole 208 is partially exposed, and test hole 206 is partially ground through. However, rear edge 207 remains intact at this stage.

After the rear edge of control track hole 204 is ground through, a lesser abrasive is applied until rear edge 207 of control track hole 206 is ground through. This occurs simultaneously with the exposure of the true cross-sectional diameter of test hole 208.

Control track holes 184, 204, 206 can be plated through with copper, copper and solder, or other conductive material. Further, the control tracks are not limited to plated-through holes. For example, a solid wire or rod can be passed through a hole previously drilled in a coupon to establish a control track.

There are a number of advantages to establishing a control track through the thickness of the coupon, particularly where the item to be exposed also extends through the thickness of the coupon. For exposing test holes in circuit board coupons, positioning of the rear edge of the control track hole parallel to the test hole insures that the test hole will not be overground. As indicated in phantom in FIG. 8B, rear edge 207 of control track hole 206 may experience only partial breakthrough yet still halt the grinding operation. Thus, test hole 208 will not be overground or underground even if the plane of the abrasive is not parallel to control track hole 206.

Grinding control system 228, FIG. 9, represents a combination of grinding guides 130 and 180. Control system 228 includes grinding guides 230, 232 connected by plated-through hole 234; control system 228 mates with a standard four-pin edge connector, but provides control over six grinding operations. Lead 236 serves as the common lead for grinding guide 230 while lead 238 serves as the common lead for grinding guide 232. During grinding, control tracks 240, 242 and 244 are successively ground through. The rear edge of common plated-through hole 234 is ground through simultaneously with the grinding of the rear edge of control track 244. Grinding guide 230 is thereby disconnected from the monitoring system (not shown), at which time the monitoring system commences monitoring of grinding guide 232. Control tracks 246, 248 and 250 are then monitored to control the last three grinding operations.

Grinding assembly 260 according to this invention, FIG. 10A, utilizes grinding guide 262 on control board 264 to control grinding of coupons 266, 268. Coupons 266, 268 are mounted on shelf 270 which is positioned relative to grinding guide 262 so that the copper-solder interface of pads 272, 274 and 276, 278 of coupons 266, 268, respectively, are ground through at a predetermined angle and to a predetermined grinding depth. Dashed line 328 represents the alignment of coupons 266, 268 with grinding guide 262.

A portion of coupon 266 and elongated pad 272 is shown in cross section in FIG. 10B. Pad 272 includes solder layer 280, copper layer 282, and interface 284 between them. The orientation of shelf 270 to control board 266 establishes a biased grinding surface represented by dashed line 286 which is at angle A, preferably six degrees for exposing an interface, relative to upper surface 288 of pad 272. Biasing the grinding surface relative to the surface of pad 272, and of interface 284, exposes interface 284 along the distance represented by arrow 290. Distance 290 is many times greater than the actual thickness of interface 284 and enhances inspection of this region.

Shelf 270, FIG. 10A, defines slot 292 which receives control board 264. Tooling pins 294, 296, shown in phantom, are then passed through tooling holes 298, 300, respectively, to engage the upper surface of coupons 266, 268. Tooling holes 298, 300 are offset from each other by angle A.

Grinding guide 262 is disposed on different layers of control board 264 so that the coarse, medium and fine control tracks are aligned with dashed line 302. Fine control track 304 is shown on exterior layer 306 of control board 264, while the medium and coarse control boards are disposed on layers 308, 310, respectively. Common lead 312 and fine lead 314 are printed on layer 306 to connect directly with fine control track 304, while only the lower portions of medium conductive lead 316 and coarse conductive lead 318 are printed on layer 306. Plated-through holes 320, 322 and 324 carry common lead 312, medium lead 306 and coarse lead 318, respectively, to the remainder of grinding guide 262.

When assembled so that shelf 270 lies along dashed line 328, grinding assembly 260 appears as shown in FIG. 11. Tooling pins 294, 296 (not shown) are placed through tooling holes 298, 300 to align shelf 270 at angle A. Tooling pins 294, 296 are preferably made of plastic or a soft metal which is easily ground through, such as copper. Grinding assembly 260 is potted such as by placing it upside down in a potting mold so that shelf 270 is supported by tooling pins 294, 296. After potting, grinding assembly 260 is ground in the direction indicated by arrow 330. Rear edges 332, 334, shown in phantom, of the coarse and medium control tracks, respectively, are successively ground through to grind away most of the material to be removed. The final grinding depth is controlled by rear edge 336 of fine control track 304.

Inner layer 308 of control board 264 is shown in FIG. 12. Conductive leads 338, 340 extend between common plated-through hole 320 and medium plated-through hole 322 to medium control track 342. In alternate constructions, rear edges 332, 334, 336 can be established by three plated-through holes offset from each other above shelf 270.

Shelf 270 can be positioned relative to control board 264 using a number of different techniques. For example, shelf 270 may include a flange which extends below tooling pin holes 346, 348 of control board 264, the flange defining holes which align with holes 346, 348 to receive tooling pins through them. Alternately, shelf 270 can be supported by brackets such as brackets 350, 352 which straddle control board 264 and support shelf 270 on biased legs 354, 356. Bracket 358, FIG. 14, slidably receives shelf 270 between projections 358, 360 and 359, 361 to clip shelf 270 in position. Bracket 358 is formed of a resilient material so that its lower portion can be compressed together, slipped through slot 292, and released to engage projections 358, 360, 359, 361 with shelf 270.

The object to be ground such as coupon 266 can simply be placed onto shelf 270 or can be attached to it using adhesives. Alternatively, coupon 266 can be installed in a preformed potting cup as shown in FIG. 15. Biased grinding assembly 370, shown with the control board removed, includes potting cup 372 in which is formed slot 374 for receiving the control board. Potting cup 372 further includes shelf 376 sloped at a 6° angle and on which are placed coupons 378, 380. The solder-copper interfaces to be exposed are located on the underside of coupons 378, 380. Slot 374 and shelf 376 are established in one construction by tool 382, FIG. 16, which includes 6° slope 384 and projection 386. A potting mold is placed around tool 382, and potting material is added which hardens to form inverted cup 372.

Shelf 376 of cup 372 establishes the relationship between coupons 378, 380 and the control board. The depth of slot 374 is preselected to align coupons 378, 380 with the control tracks on the control board.

An alternative shelf arrangement is shown in FIG. 17 for potting cup 372a which includes lands 390, 392, 394. Coupon 380a is shown with one end resting against the side of land 390 and the other end elevated by land 392. Space 396 is established beneath coupon 380a to enable potting material to flow around and under coupon 380a to insure uniform contact with plating 398. Alternatively, a cavity is established in the shelf to accept potting material beneath the coupon.

A grinding assembly according to this invention can be used to grind objects other than coupons such as objects with angled surfaces for which a different grinding surface is desired. For example, an object, such as a 6° wedge, having a lower surface with a 6° bias relative to its upper surface presents its upper surface parallel to the plane of the grinding surface when placed on a shelf according to this invention angled at 6°.

Moreover, grinding depth can be controlled by monitoring an electrical parameter other than the occurrence of an open circuit. The resistance of the control track can be monitored for an increase above a preselected level. For two parallel tracks separated by a dielectric, the capacitance of the tracks can be monitored for a decrease below a preselected level. These parameters can also be utilized to control the speed or pressure of grinding.

Although specific features of the invention are shown in some drawings and not others, this is for convenience only as each feature may be combined with any or all of the other features in accordance with the invention.

Other embodiments will occur to those skilled in the art and are within the following claims:

What is claimed is:

1. A grinding assembly for grinding an object at a predetermined angle and to a predetermined grinding depth, comprising:
   a control board carrying a grinding guide having at least two conductive leads and a conductive control track interconnecting the conductive leads; and
   a shelf having an upper surface for supporting the object and positioned relative to the control board to establish for the object a grinding surface biased at the predetermined angle relative to the control board and to align the predetermined grinding depth of the object with a portion of the rear edge of the control track so that the track is ground through when the object is ground along the biased grinding surface to the predetermined grinding depth.

2. The biased grinding assembly of claim 1 further including means for positioning the shelf and the control board relative to each other.

3. The biased grinding assembly of claim 2 in which the means for positioning includes at least two tooling pin holes in the control board for receiving tooling pin means for engaging the shelf to align it with the control board.

4. The biased grinding assembly of claim 3 in which the tooling pin holes are located to orient the tooling pin means to engage the upper surface of the object.

5. The biased grinding assembly of claim 3 in which the tooling pin means are metal pins.

6. The biased grinding assembly of claim 5 in which the metal pins are formed of a soft metal which is readily ground through.

7. The biased grinding assembly of claim 2 in which the means for positioning includes bracket means for securing the shelf relative to the control board.

8. The biased grinding assembly of claim 7 in which the bracket means includes means for slidably engaging the control board.

9. The biased grinding assembly of claim 8 in which the bracket means further includes clip means for slidably receiving the shelf.

10. The biased grinding assembly of claim 1 in which the control track includes a plated-through hole passing through the control board.

11. The biased grinding assembly of claim 1 further including means for attaching the object to the shelf.

12. The biased grinding assembly of claim 1 in which the grinding assembly is potted in a potting material.

13. The biased grinding assembly of claim 1 in which said grinding guide further includes a second control track interconnecting said conductive lead and having at least a portion of its rear edge precisely located with respect to the rear edge of the other control track.

14. The biased grinding assembly of claim 1 in which the shelf is formed in the interior of a cup for carrying the object during grinding.

15. The biased grinding assembly of claim 14 in which the cup further includes a slot for receiving the control board, the slot having a predetermined depth in relation to the upper surface of the shelf.

16. The biased grinding assembly of claim 14 in which the shelf includes a land for elevating the object at the predetermined angle.

17. A grinding assembly for grinding an object at a predetermined angle and to a predetermined grinding depth, comprising:
   a shelf having an upper surface for supporting the object;
   a control board carrying a grinding guide having at least three conductive leads and at least two conductive control tracks interconnecting the conductive leads, the rear edge of each control track precisely located with respect to the rear edge of the other control track; and
   means for positioning the shelf relative to the control board to establish a grinding surface for the object biased at the predetermined angle and to align the predetermined grinding depth of the object with a portion of the rear edge of one of the control tracks so that that track is ground through when the object is ground along the biased grinding surface to the predetermined grinding depth.

18. The grinding assembly of claim 17 in which the control board has a number of layers and each control track is disposed on a different one of the layers.

19. A grinding assembly for grinding a printed circuit board coupon at a predetermined angle to a predetermined grinding depth, comprising:
   a shelf having an upper surface for supporting the coupon;
   a control board carrying a grinding guide having at least two conductive leads and a conductive control track interconnecting the conductive leads; and
   means for positioning the shelf relative to the control board to establish a grinding plane for the coupon biased at the predetermined angle and to align the predetermined grinding depth of the coupon with a portion of the rear edge of the control track so that the track is ground through when the coupon is ground to the predetermined grinding depth to expose the coupon along the biased grinding plane at the predetermined grinding depth.

20. The grinding assembly of claim 19 in which the biased grinding plane passes through a plating interface to be exposed on the coupon.

21. The biased grinding assembly of claim 19 in which the shelf is formed in the interior of a cup for carrying the object during grinding.

* * * * *